United States Patent [19]

Yabe

[11] Patent Number: 5,406,498
[45] Date of Patent: Apr. 11, 1995

[54] FLOOR-PLANNING SYSTEM FOR PREDETERMINING A LAYOUT FOR A PCB OR AN LSI BASED ON A BLOCK DIAGRAM

[75] Inventor: Shoji Yabe, Tokyo, Japan
[73] Assignee: NEC Corporation, Tokyo, Japan
[21] Appl. No.: 14,151
[22] Filed: Feb. 8, 1993
[30] Foreign Application Priority Data
  Feb. 6, 1992 [JP] Japan .................. 4-054117
[51] Int. Cl.6 .................................. G06F 15/60
[52] U.S. Cl. ........................................ 364/491
[58] Field of Search ............... 364/488, 489, 490, 491, 364/400, 401, 402; 395/908, 916, 919, 921

[56] References Cited
U.S. PATENT DOCUMENTS 4,554,625 11/1985 Otten .................................. 364/491
4,815,003 3/1989 Putatunda et al. .................. 364/491
5,097,422 3/1992 Corbin, II et al. .................. 364/491
5,191,542 3/1993 Murofushi ........................... 364/491

Primary Examiner—Robert A. Weinhardt
Attorney, Agent, or Firm—Foley & Lardner

[57] ABSTRACT

A floor-planning system of the present invention prepares a block diagram showing blocks and the connection status among the blocks. The floor-planning system inputs a block diagram, estimates the block sizes, and estimates the aspect ratio range possible for the blocks. The system refers to the estimated block sizes and the estimated aspect ratios to specify the shapes and the arrangement of the blocks in the layout area. The system displays the block arrangement and the connection status among the blocks. The block layout is stored as layout data and utilized in feasibility judgment for a layout area on an LSI or a PCB.

9 Claims, 5 Drawing Sheets

FLOOR-PLANNING SYSTEM FOR PREDETERMINING A LAYOUT FOR A PCB OR AN LSI BASED ON A BLOCK DIAGRAM

BACKGROUNDS OF THE INVENTION

1. Field of the Invention

The present invention relates to a floor-planning system to predetermine the layout based on a block diagram at the initial stage in development of circuits such as LSI and PCB.

2. Description of the Prior Art

Conventionally, in the initial stage of designing for an LSI or other devices using a block diagram where logical connection information is not yet fixed, the block layout is not estimated and the feasibility on the applicable LSI or PCB is not judged in many cases. Even when such block layout estimation and feasibility judgment are performed, they are just studied by the designer on paper.

Thus, in such initial stage of LSI designing using a block diagram, it is not clear whether the subject to be designed and fulfilled can be accommodated in the applicable LSI chip or PCB with limited space or other restrictions. It is quite difficult to judge the feasibility of a design in such an initial stage of designing. On the other hand, if the impossibility of accommodation is found only in the layout estimation at the detail designing stage or physical design stage where feasibility on LSI or PCB becomes clear, the designer has to try to realize the design by reducing some functions or adopting another LSI or PCB.

However, at such detail designing or physical design stage, other LSIs and PCBs have also been designed; design modification as above requires re-designing in a large scale for a plurality of LSIs or PCBs, which largely influences the entire designing process. Further, it is preferred in LSI designing to route the wirings for reducing delay time of signals. Specifically, layouts having short wirings without intersections or detours which enable natural signal flow are preferred. However, such connection status of wirings is not considered in the initial designing stage and a problem may be found in the detail designing or physical design stage as described above, which requires design change.

SUMMARY OF THE INVENTION

An object of the present invention is to provide a floor-planning system which enables exact judgment of accommodation feasibility for an LSI or PCB at the initial designing stage using a block diagram and thereby eliminates the need of design change in the detail designing or physical design stage.

According to a preferred embodiment of the present invention to attain the above object, a floor-planning system comprises a block diagram input means which inputs square blocks indicating groups of functions and connection status among the blocks to make a block diagram of a circuit, a block size estimation means which estimates the sizes of the blocks in the block diagram, an aspect ratio estimation means which estimates the range of aspect ratio possible for the blocks, a block arrangement specification means which specifies the shapes and arrangement of the blocks in the layout area by referring to said estimated block sizes and estimated aspect ratios, a connection relation display means which displays the arrangement of the blocks in said layout area and the connection status of the blocks, and a layout output means which outputs the layout status displayed by said connection relation display means as the block layout data.

According to another preferred embodiment, said block size estimation means calculates the block sizes by considering the wiring area based on the number of gates determined by the function of the blocks and the number of input/output lines as well as the actual wiring intervals.

According to still another preferred embodiment, said aspect ratio estimation means calculates the aspect ratio range based on the dimensions of a component as the minimum unit for block constitution and the arrangement of such components.

According to a further preferred embodiment, the block arrangement specification means judges whether the shapes of the blocks arranged in the layout area comply with the estimated block sizes and the block aspect ratios.

According to another preferred embodiment of the present invention to attain the above object, a floor-planning system comprises a block diagram input means which inputs square blocks indicating groups of functions and connection status among said blocks to make a block diagram of a circuit, a block size estimation means which estimates the sizes of the blocks in the block diagram, an aspect ratio estimation means which estimates the range of aspect ratio possible for the blocks, a block arrangement specification means which specifies the shapes and arrangement of the blocks in the layout area by referring to the estimated block sizes and estimated aspect ratios, a connection relation display means which displays the arrangement of the blocks in the layout area and the connection status of the blocks, a control means which checks for any problem such as overlapping of blocks arranged in said layout area, sticking out of a block out of the layout area as well as intersection, detour and improper signal flow in wiring and, if it finds any problem, instructs modification of the block diagram by the block diagram input means or change of shapes and arrangement of the applicable blocks by the block arrangement specification means and a layout output means which outputs the layout status displayed by the connection relation display means as the block layout data.

According to a further preferred embodiment, said block size estimation means calculates the block sizes by considering the wiring area based on the number of gates determined by the function of the blocks and the number of input/output lines as well as the actual wiring intervals.

According to a still further preferred embodiment, said block aspect ratio estimation means calculates the aspect ratio range based on the dimensions of a component as the minimum unit for block constitution and the arrangement of such components.

According to a still another embodiment, said block arrangement specification means judges whether the shapes of the blocks arranged in said layout area comply with the estimated block sizes and the block aspect ratios.

Other objects, characteristics and effects of the present invention will be clarified in the detailed description below.

DESCRIPTION OF THE PREFERRED EMBODIMENT

Referring to the attached figures, a preferred embodiment of the present invention will be described in detail below.

Figure 1:
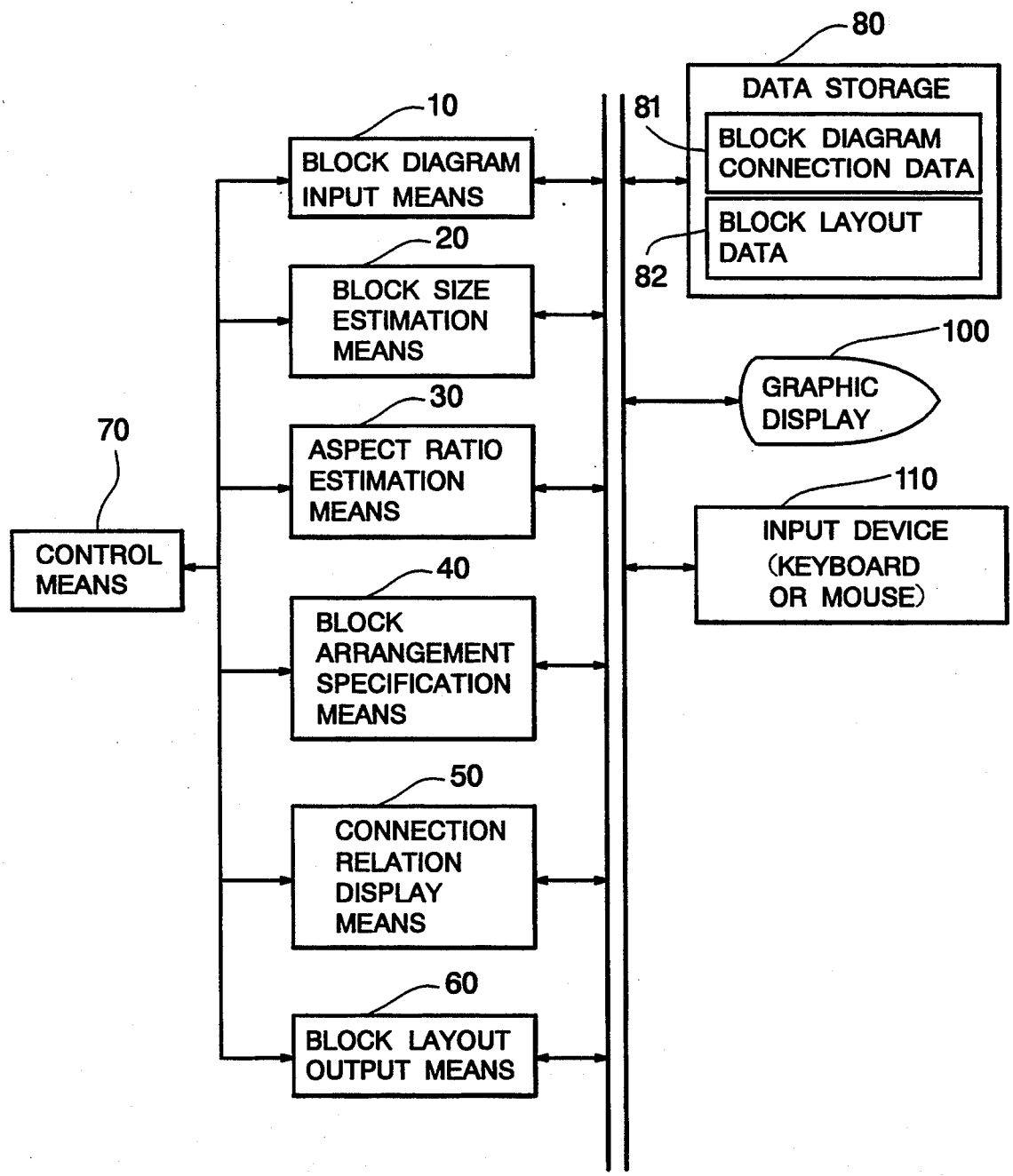
FIG. 1 is a block diagram to show the configuration of a floor-planning system according to a preferred embodiment of the present invention.

FIG. 1 shows the configuration of a floor-planning system according to a preferred embodiment of the present invention. In the figure, a floor-planning system comprises a block diagram input means 10, a block size estimation means 20, an aspect ratio estimation means 30, a block arrangement specification means 40, a connection relation display means 50, a block layout output means 60, a control means 70 and a connection data storage 80 to store block diagram connection data 81 and the block layout data 82. Each means is controlled by the control means 70. The floor-planning system is further provided with a graphic display 100 as well as an input device 110 (keyboard or mouse) so that an operator can input various data by looking at a display on the screen of the graphic display 100. This floor-planning system can be realized by a workstation or a personal computer.

The block diagram input means 10 inputs blocks each of which represents a certain function group and the mutual connection relation among such blocks to draw a block diagram. The block size estimation means 20 estimates the sizes of the blocks in the block diagram by referring to the block diagram drawn as above. The aspect ratio estimation means 30 refers to the block diagram and the size data of the blocks to estimate the range of the length-to-breadth ratio (aspect ratio) for each of the blocks. The block arrangement specification means 40 specifies the shapes and arrangement locations of the blocks in the layout area on the applicable LSI or PCB. The connection relation display means 50 has the connection status among the blocks displayed on the graphic display 100. The block layout output means 60 outputs and stores the block layout finally displayed by the connection relation display means 50 as block layout data to the data storage 80. The data storage 80 is a memory to keep the drawn block diagram and the finally decided block layout.

Figure 3A:
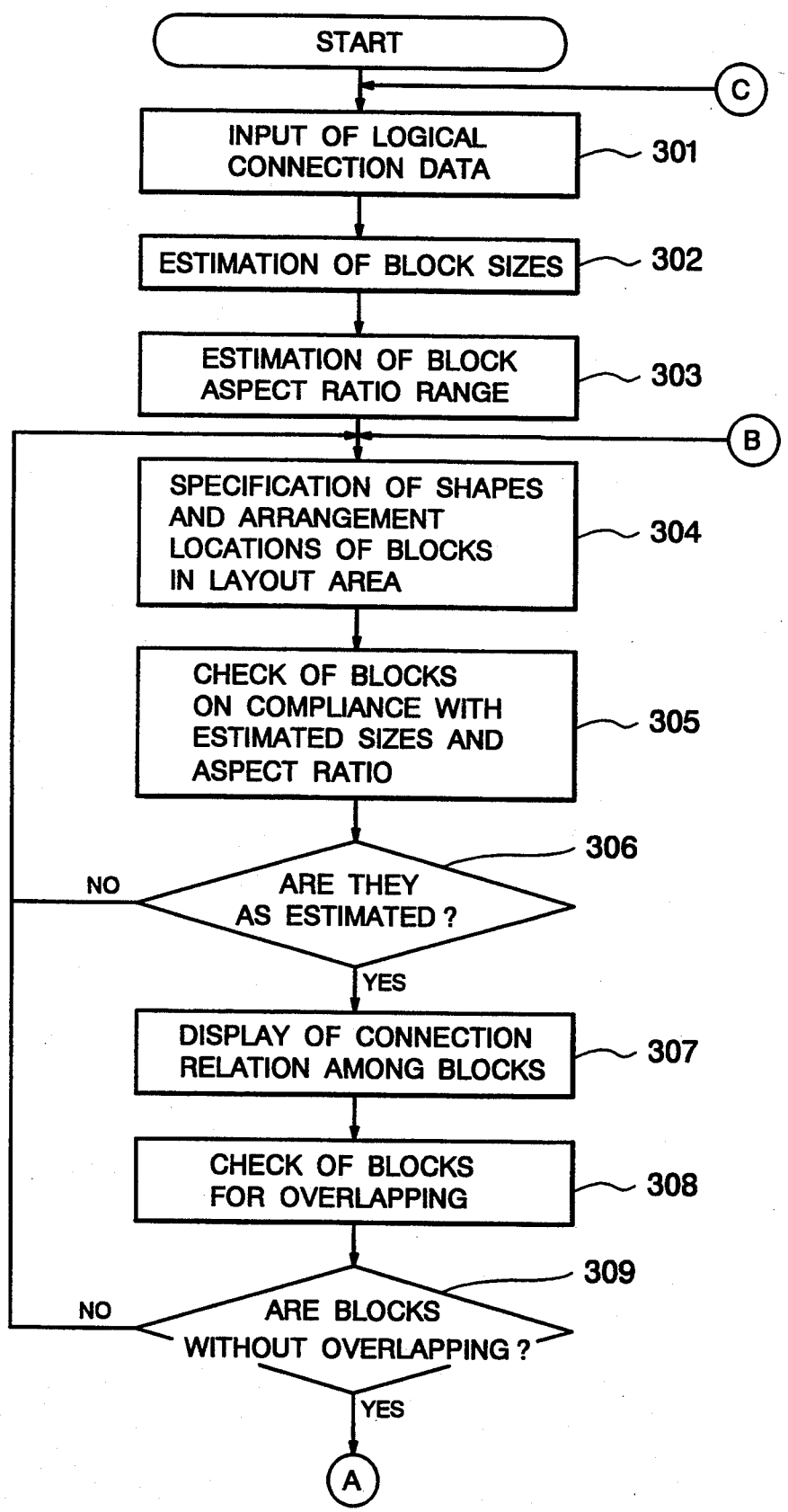
Figure 3B:
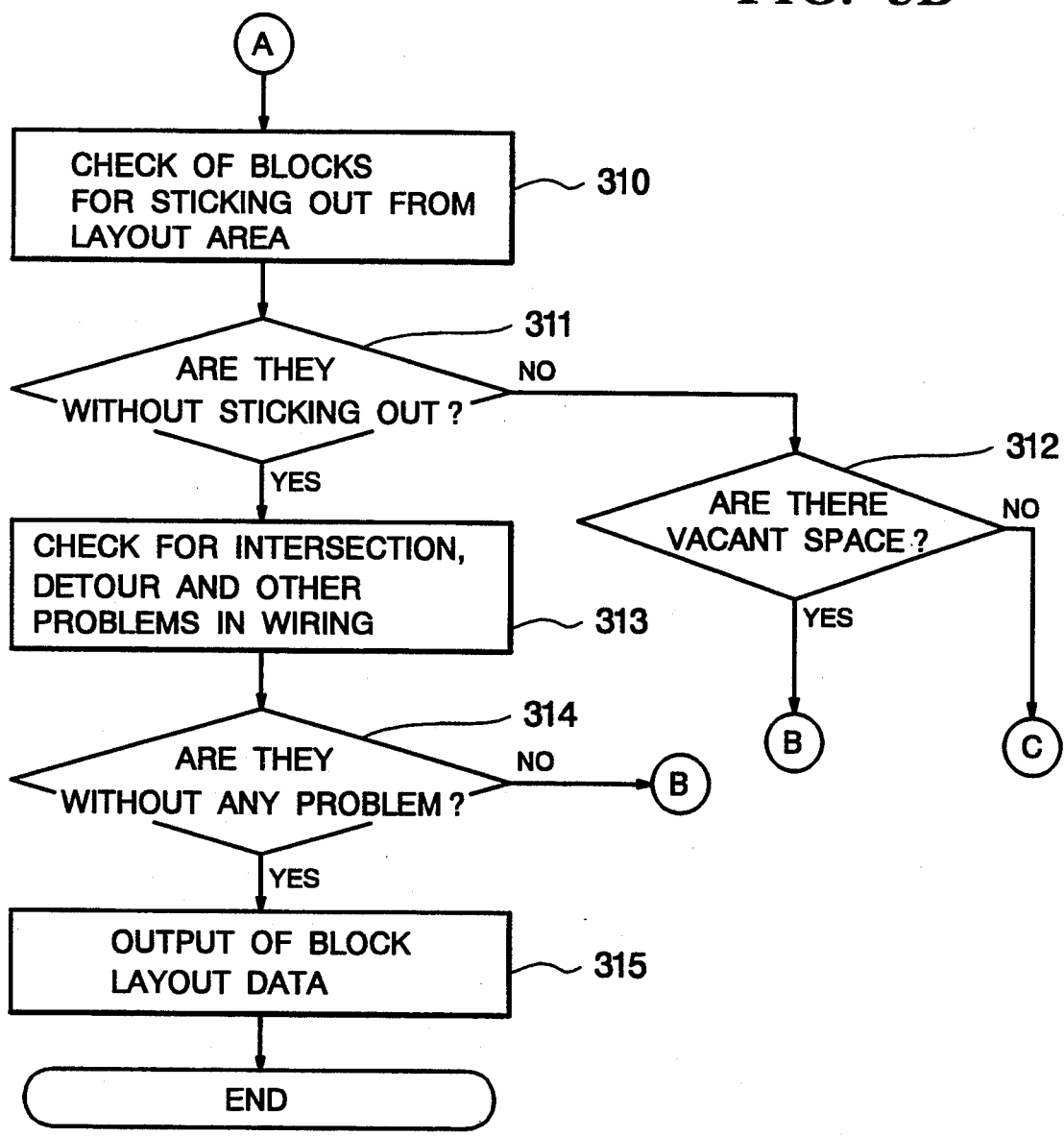

Referring now to the flowchart of FIGS. 3A and 3B, the operation of this floor-planning system is described below.

First of all, logical connection data are input for a block diagram drawing though the entire logic is not yet fixed (Step 301). In other words, using an input device 110 such as a mouse, the operators inputs blocks each of which represents a certain group of logic (function) and wiring status among the blocks by checking the display on the graphic display 100.

Figure 2A:
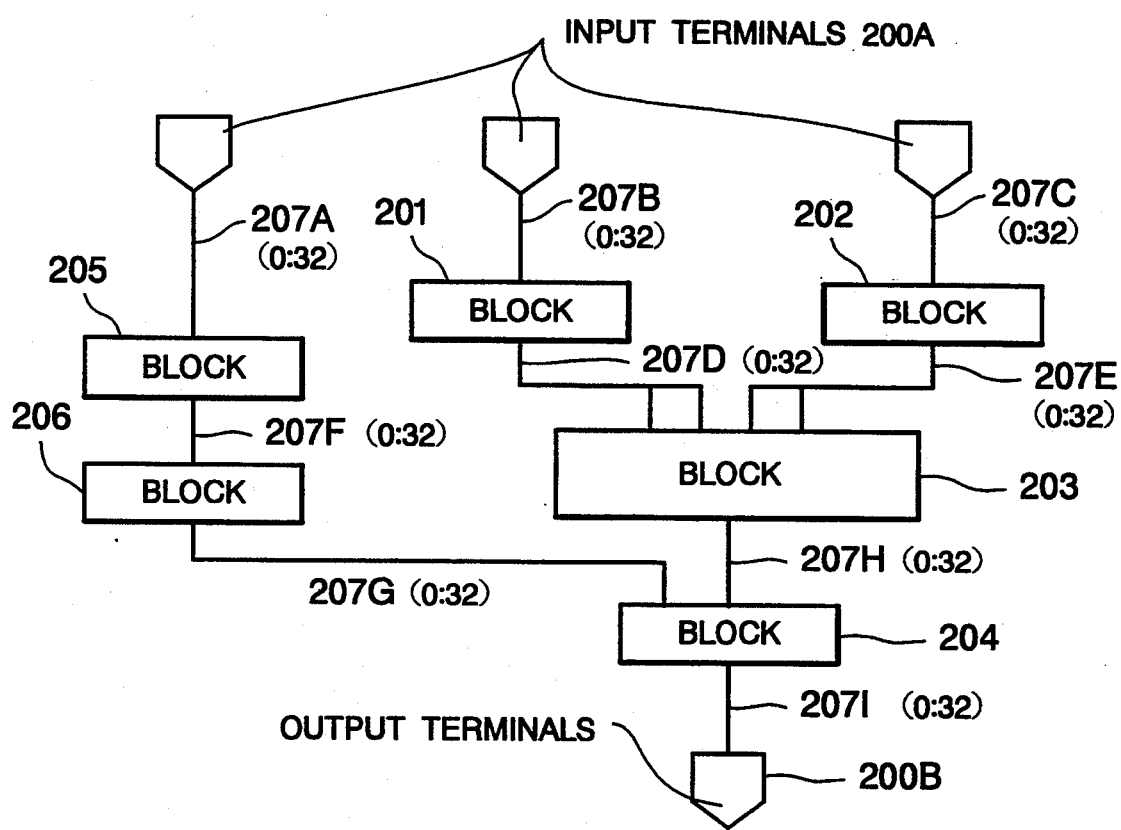
FIG. 2A is a diagram to show an example of a block diagram prepared by a block diagram input means.

FIG. 2A shows an example of a block diagram input and prepared using the block diagram input means 10. In the figure, the block diagram contains input terminals 200A, output terminals 200B, a plurality of blocks 201 to 206 representing certain function groups, buses and other wirings 207A to 207I for connection among the blocks. To draw such a block diagram, the functions of the blocks 201 to 206 and bit widths of the wirings 207A to 207I are to be input as data. In the example in the figure, the numeral "32" indicates that each wiring has a width of 32 bits.

The block diagram drawn by the block diagram input means 10 is stored in the data storage 80 as the block diagram connection data 81. The block diagram connection data 81 does not contain information for a circuit, but contains major signal flow serving as the base of the entire circuit.

Then, the block size estimation means 20 refers to the block diagram connection data 81 as above and estimates the sizes of the blocks included in the block diagram (Step 302). Since the logic among the blocks is not specifically fixed at this stage, the approximate number of gates is determined based on the functions to be fulfilled by the blocks and the number of input/output lines. Such a number of gates may be automatically determined by the block size estimation means 20 or may be manually input by the designer from the input device 110 (keyboard or other). Based on the determined number of gates and the type of wiring technology, the block size estimation means 20 estimates the block sizes by taking the actual wiring area into account. The wiring technology type here means classification by the wiring intervals (defined in the order of microns).

Then, with referring to the block diagram connection data 81 and the block size data estimated by the block size estimation means 20, the aspect ratio estimation means 30 estimates the range of the length-to-breadth ratio (aspect ratio) for the blocks (Step 303).

The aspect ratio range is usually set from 0.5 to 2, with the reference value of 1 (i.e. a regular square). Some blocks, however, may have the minimum unit component for block function fulfillment (primitive cell of 1 bit, for example) with the minimum horizontal or vertical dimensions fixed, and the number of components (with the number of bits) in a block or the arrangement of components (whether they are laid horizontally or vertically) may be fixed. In such a case, the range of the aspect ratio needs to be decided subject to those conditions.

Then, the block arrangement specification means 40 specifies the shape and the arrangement location for each of the blocks in the layout area 210 on the applicable LSI or PCB (Step 304). With the block arrangement specification means 40, the designer can specify the shapes and arrangement locations of the blocks on the graphic display 100 by using the input device 110 such as a mouse.

Figure 2B:
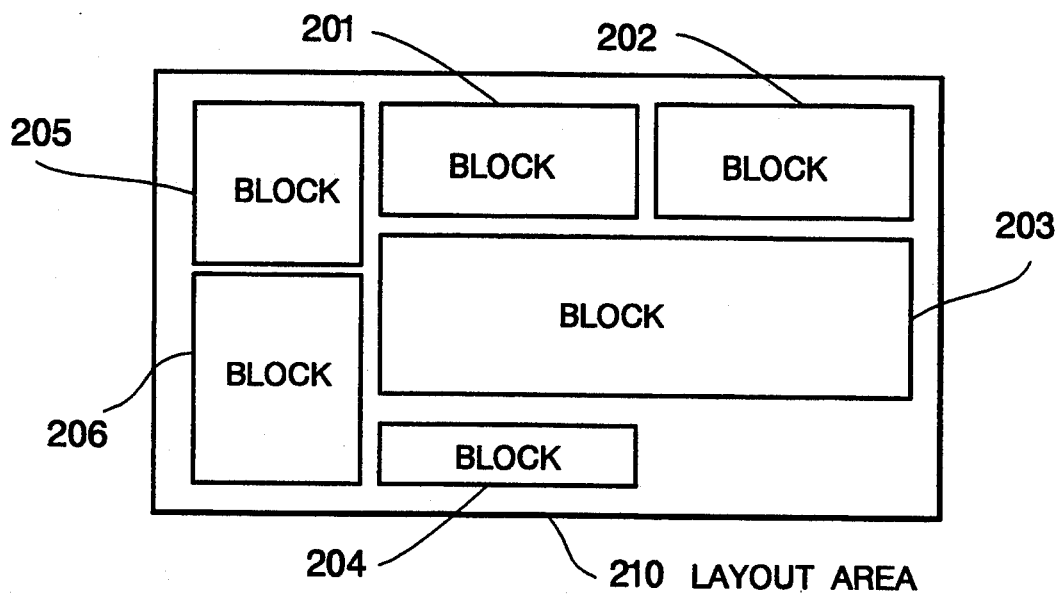
FIG. 2B is a diagram to show an example of a block layout where blocks are arranged by a block arrangement specification means.

The block arrangement specification means 40 refers to the estimated sizes of the blocks and the estimated aspect ratio range and checks whether the specified block sizes and the block aspect ratio are as estimated or not (Step 305). When any block size is larger or smaller than estimated or when any block aspect ratio is out of the estimated range (Step 306), the system requests the block arrangement specification means 40 to perform specification again. If the sizes and aspect ratio are as estimated for all the blocks, the system proceeds to the next processing step. FIG. 2B shows the blocks arranged in the layout area 210 by the block arrangement specification means 40.

Figure 2C:
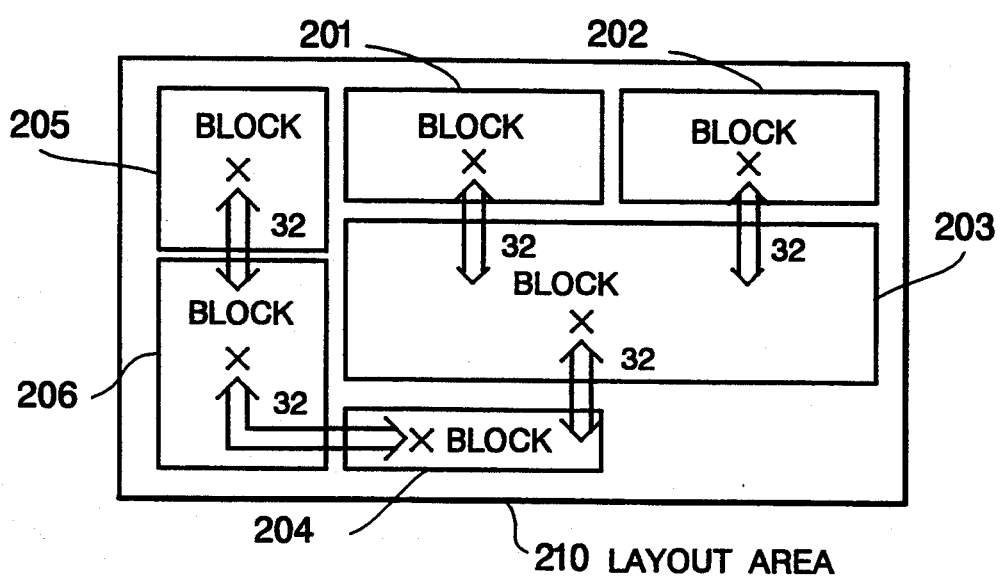
FIG. 2C is a diagram to show an example of block layout expressed by a connection relation display means and FIGS. 3A and 3B are flowcharts to illustrate the operation of a floor-planning system.

Next, the connection relation display means 50 displays how the blocks are connected based on the block layout specified by the block arrangement specification means 40 (Step 307). FIG. 2C shows an example of such display. As shown in the figure, connections among the blocks are given as arrows representing wirings with the bit number attached ("32 bits", for example).

Further, the control means 70 checks for any overlapping of blocks (Step 308). If some blocks are overlapped (Step 309), then the block arrangement specification means 40 specifies again the shapes and locations of the blocks so as to eliminate overlapping.

If no overlapping is found in Step 309, the control means 70 checks for any sticking out of blocks from the layout area 210 (Step 310). If a block sticking out of the layout area 210 is found (Step 311), it is checked whether there is any vacant space in the layout area 210 (Step 312). If there is vacant space, the block arrangement specification means 40 changes the shape and location of the applicable block using that vacant space. If there is no sufficient vacant space, it means that the planned functions cannot be accommodated in the layout area of the applicable LSI or PCB, and the block diagram needs to be modified by the block diagram input means 10 by reducing functions to be performed by the blocks, for example.

If no block is sticking out of the layout area in Step 311, the control means 70 checks for any intersection or detour in wiring among blocks or for improper signal flow (Step 313). If any of such problems is found, wirings are modified by changing the locations or shapes of related blocks by the block arrangement specification means 40.

In any case, any change in block shape or arrangement location by the block arrangement specification means 40 must be followed by display of the block layout and the connection status by the connection relation display means 50.

If no wiring problem is found in Step 314, the system stores the finally determined layout to the data storage 80 as the block layout data 82 using the block layout output means 60.

The block layout data 82 thus stored can be referred to at any time during detail designing thereafter and effectively utilized in estimation of input/output line length and signal delay time.

Thus, the floor-planning system according to this embodiment enables feasibility judgment for a design in relation to the layout area on the applicable LSI or PCB in a quite early stage of designing.

Overlapping of blocks, sticking out of any block from the layout area 210, intersection and detour in connections among blocks and improper signal flow checked by the control means 70 in the above embodiment can be confirmed by the designer on the graphic display. In this case, every time any shape or arrangement location of a block is changed, the block layout and the connection status must be displayed with the connection relation display means 50 so that they can be checked on the screen.

Obviously, various modifications can be made to the above embodiments. It is intended to cover in the appended claims all such modifications and variations as fall within the true spirit and scope of the present invention.

What is claimed is:

1. A floor-planning system comprising:
   block diagram input means for inputting design parameters known at a time of initial block diagram design of a circuit, said design parameters including a plurality of square blocks indicating groups of desired functions of said circuit, connections between said square blocks and bit widths corresponding to each of said connections, said design parameters being input in a form of said block diagram,
   block size estimation means for estimating sizes of blocks corresponding on a one-to-one basis to each of said square blocks in said block diagram, wherein said sizes of said blocks are estimated based on a number of gates corresponding to said functions associated with each of said corresponding square blocks and said bit widths corresponding to said connections between each of said corresponding square blocks and other of said square blocks;
   aspect ratio estimation means for estimating a range of aspect ratios possible for said blocks,
   block arrangement specification means for specifying shapes and arrangement of said blocks in a layout area based on said design parameters, said estimated block sizes and said estimated aspect ratios,
   connection relation display means for displaying said arrangement of said blocks in said layout area and connections between said blocks, and
   layout output means for outputting said blocks arranged in said layout area and said connections between said blocks in said layout area as displayed by said connection relation display means.

2. A floor-planning system of claim 1 wherein said block size estimation means calculates a size of one of said blocks based on a number of gates determined needed for performing said function of one of said square blocks corresponding to said one block, a wiring area determined to be needed by said one of said square blocks corresponding to said one block, and a number of input/output lines determined by bit-widths corresponding to said connections between said one of said square blocks corresponding to said one block and other of said square blocks.

3. A floor-planning system of claim 1 wherein said aspect ratio estimation means calculates an aspect ratio range based on dimensions of one or more components needed for said block by said block size estimation means as and an arrangement of said one or more components.

4. A floor-planning system of claim 1 wherein said block arrangement specification means judges whether said shapes of said blocks arranged in said layout area comply with said estimated block sizes and said block aspect ratios.

5. A floor-planning system comprising:
   block diagram input means for inputting design parameters known at a time of initial block diagram design of a circuit, said design parameters including a plurality of square blocks indicating groups of desired functions of said circuits connections between said square blocks and bit widths corresponding to each of said connections, said design parameters being input in a form of said block diagram,
   block size estimation means for estimating sizes of blocks corresponding on a one-to-one basis to each of said square blocks in said block diagram, wherein said sizes of said blocks are estimated based on a number of gates corresponding to said functions associated with each of said corresponding square blocks and said bit widths corresponding to said connections between each of said corresponding square blocks and other of said square blocks;

aspect ratio estimation means for estimating a range of aspect ratios possible for said blocks, block arrangement specification means for specifying shapes and arrangement of said blocks in a layout area based on said design parameters, said estimated block sizes and said estimated aspect ratios, control means for checking for circuit layout problems including overlapping of said blocks arranged in said layout area, sticking out of any of said blocks from said layout area as well as intersection, detour and improper signal flow in wiring and, if any of said circuit layout problems are found, instructing said block arrangement specification means to respecify said shapes and arrangement of said blocks in said layout area if said control means determines that sufficient vacant space exists on said layout area so that said circuit layout problem can be corrected by said respecifications and instructing modification of said block diagram by said block diagram input means if said vacant space is determined to be insufficient, and layout output means for outputting said blocks arranged in said layout area and said connections between said blocks in said layout area as displayed by said connection relation display means.

6. A floor-planning system of claim 5 wherein said block size estimation means calculates a size of one of said blocks based on a number of gates determined needed for performing said function of one of said square blocks corresponding to said one block, a wiring area determined to be needed by said one of said square blocks corresponding to said one block, and a number of input/output lines determined by bit-widths corresponding to said connections between said one of said square blocks corresponding to said one block and other of said square blocks.

7. A floor-planning system of claim 5 wherein said aspect ratio estimation means calculates an aspect ratio range based on dimensions of one or more components needed for said block by said block size estimation means as and an arrangement of said one or more components.

8. A floor-planning system of claim 5 wherein said block arrangement specification means judges whether said shapes of said blocks arranged in said layout area comply with said estimated block sizes and said block aspect ratios.

9. A method of planning a layout of a circuit comprising the computer implemented steps of:

(a) inputting design parameters known at a time of initial design of a block diagram of said circuit, wherein said design parameters include a plurality of square blocks indicating groups of desired functions of said circuit, connections between said square blocks and bit widths corresponding to each of said connections;

(b) estimating sizes of blocks corresponding on a one to one basis to said square blocks, wherein said sizes of said blocks are estimated based on a number of gates corresponding to said functions associated with each of said corresponding square blocks and said bit widths corresponding to said connections between each of said corresponding square blocks and other of said square blocks;

(c) estimating a range of aspect ratios possible for each of said blocks based on said functions associated with each of said corresponding square blocks;

(d) specifying shapes and arrangements of said blocks onto a layout area based on said design parameters, said estimated block sizes and said estimated aspect ratios;

(e) checking said shapes of said blocks to ensure that each of said blocks conforms to said estimated block sizes and said estimated aspect ratios corresponding to each of said blocks;

(f) displaying connections of said blocks onto said layout area;

(g) checking said arrangements of said blocks onto said layout area to ensure that none of said blocks overlaps with any other of said blocks and that none of said blocks sticks out from said layout area;

(h) if any of said blocks are arranged incorrectly such that one of said blocks overlaps with said any other of said blocks or that one of said blocks sticks out from said layout area so as to create an arrangement problem, determining if there is any vacant space within said layout area so that said blocks can be rearranged such that none of said blocks overlap with another of said blocks and none of said blocks stick out from said layout area, and if there is said vacant space available, returning to step (d) for correcting said arrangement problem of said blocks by attempting a different arrangement of said blocks by using said vacant space to place a portion or all of some of said blocks into said layout area;

(i) checking said blocks arranged onto said layout area to determine if there are any wiring problems associated with any connections of one of said blocks to another of said blocks, and if there are determined to be one or more of said wiring problems, returning to step (d) in order to rearrange said blocks for correcting said wiring problems; and (j) outputting a layout of said blocks arranged onto said layout area and said connections of said blocks with said other blocks on said layout area if none of said wiring problems and said arrangement problems are detected.

* * * * *